(12) United States Patent
Sarno et al.

(10) Patent No.: US 7,286,365 B2
(45) Date of Patent: Oct. 23, 2007

(54) ELECTRONIC SUBSTRATE FOR A THREE-DIMENSIONAL ELECTRONIC MODULE

(75) Inventors: Claude Sarno, Etoile S/Rhone (FR); Jean-Luc Durand, Valence (FR); Christophe Jarnias, Valence (FR)

(73) Assignee: Thales, Neuilly-sur Seine (FR)

( * ) Notice: Subject to any disclaimer, the term of this patent is extended or adjusted under 35 U.S.C. 154(b) by 131 days.

(21) Appl. No.: 10/527,378

(22) PCT Filed: Oct. 10, 2003

(86) PCT No.: PCT/FR03/02999
§ 371 (c)(1),
(2), (4) Date: Mar. 11, 2005

(87) PCT Pub. No.: WO2004/034761
PCT Pub. Date: Apr. 22, 2004

(65) Prior Publication Data
US 2005/0270750 A1 Dec. 8, 2005

(30) Foreign Application Priority Data
Oct. 11, 2002 (FR) .................................. 02 12681

(51) Int. Cl.
*H05K 7/20* (2006.01)

(52) U.S. Cl. ....................... 361/721; 361/689; 361/704; 361/714; 257/686; 257/693; 174/16.3

(58) Field of Classification Search ................ 361/689, 361/700, 703–709, 714, 717–729, 735, 739, 361/760, 790, 749, 728; 174/16.3, 252, 52.4; 29/830; 257/678, 686, 687, 706, 712, 722, 257/737, 738, 778, 685, 693; 165/80.3, 185; 333/246
See application file for complete search history.

(56) References Cited

U.S. PATENT DOCUMENTS 3,648,113 A 3/1972 Rathjen et al.
(Continued)

FOREIGN PATENT DOCUMENTS

EP 0461753 A 12/1991
(Continued)

*Primary Examiner*—Michael Datskovskiy
(74) *Attorney, Agent, or Firm*—Lowe Hauptman & Berner, LLP

(57) ABSTRACT

The invention relates to an electronic substrate suitable for being included in a stack containing said electronic substrate and at least one other electronic substrate and suitable for being connected to the other electronic substrate and optionally to an input-output interface, wherein it comprises a frame consisting of a material with a high thermal conductivity comprising a plurality of sides, a first side of which is intended to be in contact with the corresponding side of the frame of another neighboring substrate so as to provide thermal dissipation of the electronic substrates and a second side of which comprises an interconnection element intended to provide electrical interconnection between said electronic substrate and the other electronic substrate(s) by means of a routing circuit between said electronic substrate and the input-output interface.

15 Claims, 3 Drawing Sheets

U.S. PATENT DOCUMENTS

| | | |
|---|---|---|
| 3,904,933 A | 9/1975 | Davis |
| 4,868,712 A * | 9/1989 | Woodman .................... 361/689 |
| 5,053,853 A * | 10/1991 | Haj-Ali-Ahmadi et al. . 257/693 |
| 5,181,167 A * | 1/1993 | Davidson et al. ........... 361/699 |
| 5,266,912 A * | 11/1993 | Kledzik ....................... 333/247 |
| 5,644,277 A * | 7/1997 | Gulick et al. ................ 333/246 |
| 5,677,830 A | 10/1997 | Nogas et al. |
| 5,943,213 A * | 8/1999 | Sasov ......................... 361/705 |
| 6,201,698 B1 * | 3/2001 | Hunter ....................... 361/704 |
| 6,351,029 B1 * | 2/2002 | Isaak .......................... 257/688 |
| 6,380,616 B1 * | 4/2002 | Tutsch et al. ................ 257/686 |
| 6,394,815 B1 | 5/2002 | Sarno et al. |
| 6,498,728 B1 | 12/2002 | Sarno et al. |
| 6,627,980 B2 * | 9/2003 | Eldridge ..................... 257/678 |
| 6,661,664 B2 | 12/2003 | Sarno et al. |
| 6,695,520 B1 | 2/2004 | Sarno et al. |

FOREIGN PATENT DOCUMENTS

| | | |
|---|---|---|
| EP | 0461753 A2 * | 12/1991 |
| EP | 0478188 A2 * | 4/1992 |
| EP | 0558855 A2 * | 3/1993 |
| EP | 0545563 A | 6/1993 |
| EP | 0560502 A | 9/1993 |
| GB | 2145571 A * | 3/1985 |

* cited by examiner

ELECTRONIC SUBSTRATE FOR A THREE-DIMENSIONAL ELECTRONIC MODULE

CROSS-REFERENCE TO RELATED APPLICATIONS

The present Application is based on International Application No. PCT/FR2003/002999, filed on Oct. 10, 2003, which in turn corresponds to FR 02/12681 filed on Oct. 11, 2002, and priority is hereby claimed under 35 USC §119 based on these applications. Each of these applications are hereby incorporated by reference in their entirety into the present application.

FIELD OF THE INVENTION

The invention relates to an electronic substrate for a three-dimensional (3D) electronic module, that is to say one which contains a stack of a plurality of electronic substrates in a small volume. An electronic substrate conventionally includes a support and components.

BACKGROUND OF THE INVENTION

The invention also relates to a 3D electronic module.

A 3D electronic module typically consists of a plurality of layers of electronic substrates molded in resin. The electrical interconnection between the layers of electronic substrates is provided by conductors etched on the outer walls of the 3D module. This 3D module typically has the following dimensions, of the order of: $5 \times 5 \times 5$ cm$^3$.

The field of the invention is that of thermal dissipation in 3D electronic modules. These 3D modules are used in sectors as varied as aeronautics, telecommunications, transport (automobiles, railroad, etc.) and may relate to power supplies, sensors, GPS devices, etc.

The power density of electronic substrates is regularly increasing according to the growth in the number of components of a given substrate and their miniaturization; it may be as much as or exceed 20 W.

DESCRIPTION OF THE RELATED ART

A first solution to the thermal dissipation problem of an electronic substrate consists in using a fan or a micropump that requires an external power supply, which is a source of extra heat, weight and bulk; the dissipation of heat is furthermore not distributed homogeneously.

Another solution consists in dissipating the heat using the sink technique by adding a thermally conductive material such as copper, which entails making the substrate significantly heavier in view of the weight of copper.

A third solution consists in integrating a phase-change cooling device into the thickness of the support of the substrate, such as a heat pipe consisting of a metal casing containing water vapor that condenses under the effect of cooling. The drawback of a heat pipe is that it is bulky and not very capable of withstanding environmental constraints such as acceleration.

These drawbacks encountered in the case of an electronic substrate are exacerbated when it is necessary to dissipate heat in an electronic module containing a stack of electronic substrates.

It is therefore an important object of the invention to improve the thermal dissipation of a 3D electronic module.

Furthermore, existing 3D modules are configured so that it is not possible either to access one of the substrates or modify it, change it or reuse and existing substrate on a rack.

It is therefore another object of the invention to provide a 3D electronic module which does not have these drawbacks.

SUMMARY OF THE INVENTION

In order to achieve these objects, the invention relates to an electronic substrate suitable for being included in a stack containing said electronic substrate and at least one other electronic substrate and suitable for being connected to the other electronic substrate(s) and optionally to an input-output interface, principally characterized in that it comprises a frame consisting of a material with a high thermal conductivity comprising a plurality of sides, at least one first side of which is intended to be in contact with the corresponding side of the frame of another (or the other) neighboring substrate(s) so as to provide thermal dissipation of the electronic substrates and at least one second side of which comprises an interconnection element intended to provide electrical interconnection between said electronic substrate and the other electronic substrate(s) by means of a routing circuit and/or between said electronic substrate and the input-output interface.

The function of each frame is thus to provide the heat exchange and the electrical contacts between the substrates and/or between one (or more) substrate(s) and the input-output interface.

It is hence sufficient to modify the routing circuit in order to modify the interconnections between the electronic substrate and the other substrates, without intervening on the substrate: this results in enhanced interchangeability and modularity.

According to one characteristic of the invention, at least one frame has a bottom consisting of a material with a high thermal conductivity, this frame optionally including a phase-change cooling element. This cooling mode is preferably selected in order to dissipate a power of more than approximately 5 W.

According to a preferred embodiment, each substrate has conductive tracks and the interconnection element includes a first conductive element intended to be in contact with the tracks, a second conductive element intended to be connected to the routing circuit with a view to connecting this second conductive element to at least one conductive element of the interconnection element of the frame of a neighboring substrate.

According to one characteristic of the invention, the frame includes reversible positioning means intended to position said frame with respect to the frame of the other neighboring electronic substrate and/or with respect to the input-output interface.

The positioning of the framed substrates with respect to one another is therefore not definitive: the framed substrates are removable. They can easily be detached from one another, for example in order to be replaced or modified.

The invention also relates to electronic module having an input-output interface and a stack of a plurality of electronic substrates such as the one described above.

It furthermore has a package suitable for holding the stack of framed electronic substrates and/or a cover comprising the input-output interface.

According to one characteristic of the invention, the cover includes means for fastening to the package, which are preferably removable, and the fastening means are suitable for stabilizing the framed substrates in the package.

The positioning of the framed substrates in the package is therefore not definitive. They can easily be removed from the package, for example in order to be replaced or modified.

Other characteristics and advantage of the invention will become apparent on reading the following detailed description, which is given by way of nonlimiting example and refers to the appended drawings, in which:

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

DETAILED DESCRIPTION OF THE INVENTION

Figure 1A:
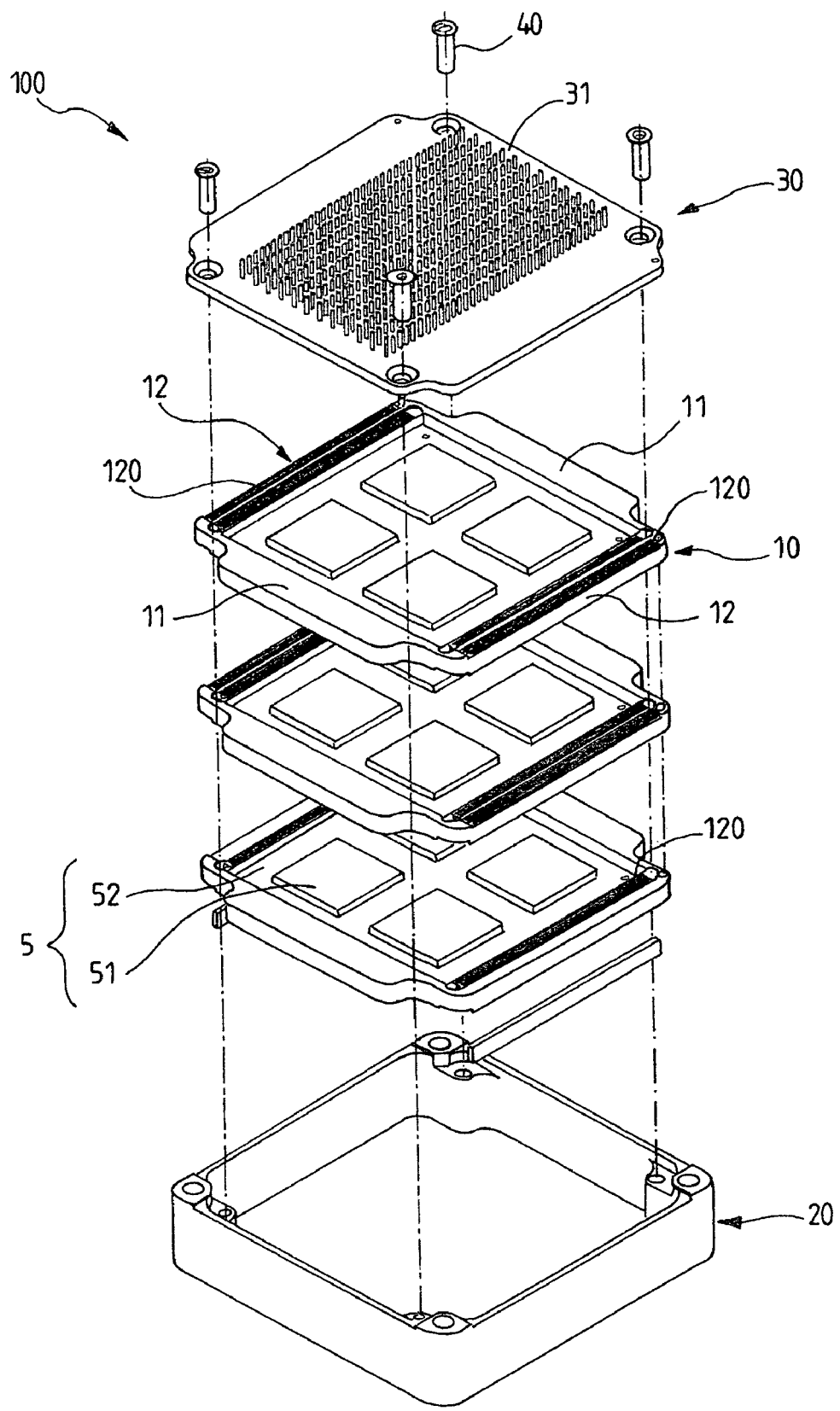
FIGS. 1a and 1b schematically represent an electronic module according to the invention, FIG. 1a being an exploded view and FIG. 1b being a view in section, FIG. 2 schematically illustrates the electrical interconnection between electronic substrates and between electronic substrates and the input-output interface, as a view in section, FIG. 3 schematically represents a detailed view of a conductive element, FIG. 4 schematically represents an exploded view of an interconnection element.
Figure 1B:
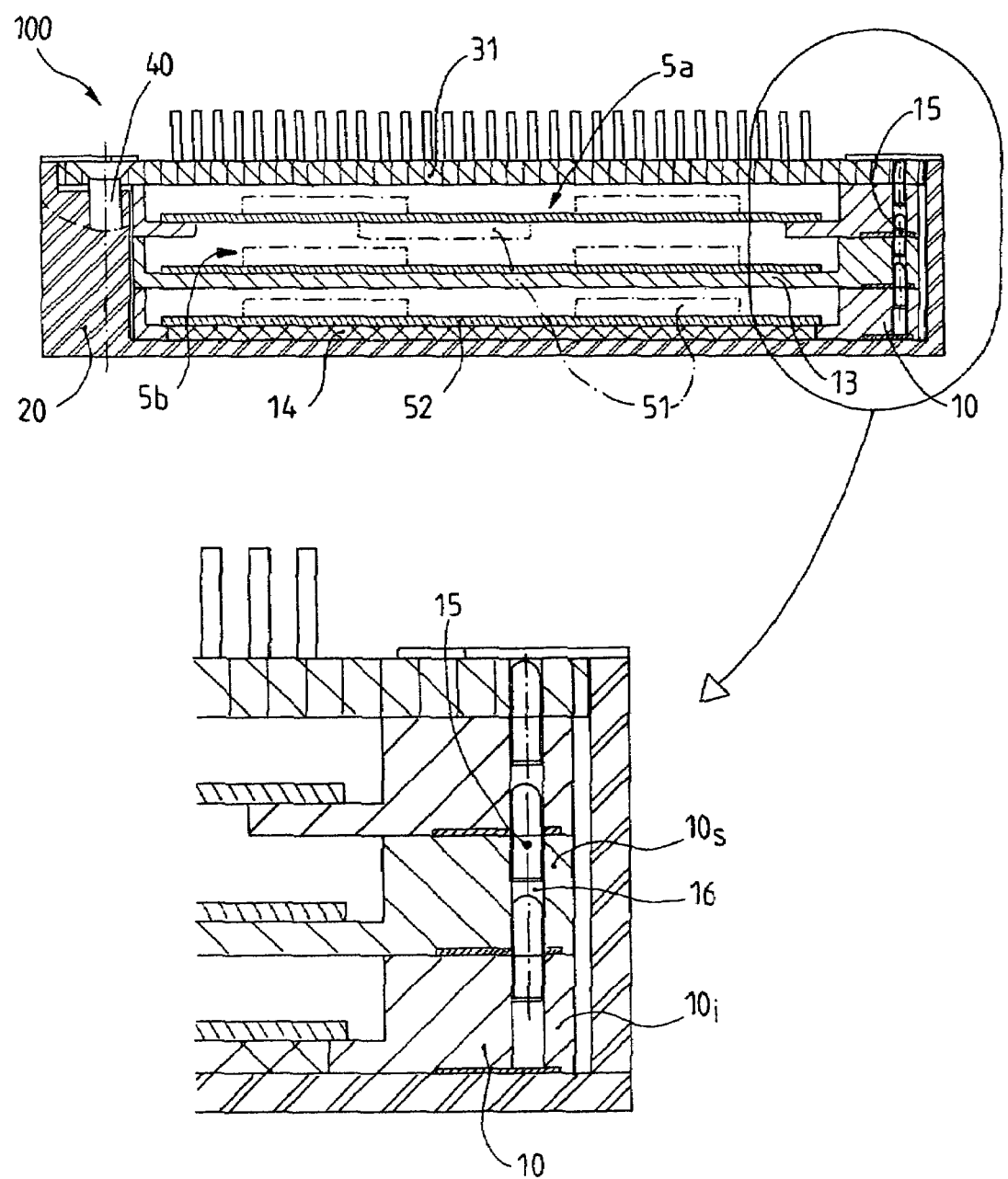

As represented in FIGS. 1a and 1b, the electronic module 100 according to the invention (also referred to as a 3D electronic module) includes a plurality of electronic substrates 5, for example three substrates 5a, 5b, 5c, each substrate 5 being provided with a frame 10 consisting of a material with a high thermal conductivity, the framed substrates 5 being stacked on one another in a package 20 closed by a cover 30, which includes an input-output interface 31; the package 20 preferably also consists of a material with a high thermal conductivity.

For example, the material with a high thermal conductivity is aluminum, copper or graphite. It will be recalled that aluminum can dissipate up to approximately 150 W/m×K (watts per meter per kelvin), and copper approximately 400 W/m×K.

The function of each frame 10 is to provide the heat exchange and the electrical contacts between the substrates 5 and/or between one (or more) substrate(s) 5 and the input-output interface 31. The frame 10 preferably has four sides. Two sides 11 of the frame are intended for the heat exchange, for example, while each of the two other sides 12 has an interconnection element 120 intended for the electrical contacts. Of course, a frame 10 may includes only one interconnection element 120.

An electronic substrate 5 conventionally includes a support 52 and components 51. The support 52 may differ or be the same from one substrate to another. The electronic substrates are distinguished in particular according to their support, which may be made of epoxy in which case in it is referred to as a printed circuit, of ceramic, of gallium arsenide (AsGa), or it may consist of a metallized insulator, etc.

Various cooling modes illustrated in FIG. 1b may be used in order to dissipate the heat coming from the substrate 5, i.e. in order to send the heat from the substrate 5 to its frame 10.

The substrate may be double-faced 5a and the heat sent by conduction in the substrate and natural convection to the frame 10; this cooling mode is highly suitable for dissipating a power of between 0 and approximately 2 W.

The frame 10 may also have a bottom 13 generally consisting of the same material as the frame: the substrate 5b, which is not then double-faced, is placed on the bottom 13 which acts as a passive metal sink; this cooling mode is highly suitable for dissipating a power of between approximately 2 and 5 W.

This bottom 13 may act as an active metal sink if a heat pipe 14 is furthermore integrated in the thickness of the bottom; this cooling mode is preferably selected in order to dissipate a power of more than approximately 5 W, a heat pipe being capable of dissipating up to approximately 1000 W/mK.

Lastly, the 3D electronic module can accommodate different substrate technologies (the support may vary from one substrate to another) and different cooling modes (the cooling mode may vary from one frame to another).

The framed substrates 5 are stacked in a package 20 so that the frame sides 11 intended for the heat exchange are in contact with one another. The package 20, the purpose of which is of course to protect the substrates 5 from dust, shocks, etc. is also suitable for dissipating heat: it preferably consists of the same material as the frames 10.

When they are being stacked in the package 20, the framed substrates 5 are mutually positioned with precision, in particular so as to provide good heat exchange from one frame to another and good electrical interconnection between them and/or between them and the input-interface of the casing. They are mutually positioned reversibly: each of the framed substrates stacked in the package is thus removable.

In order to simplify the explanations in relation to the positioning of the frames, two neighboring frames 10 referred to as the lower frame 10 and the upper frame $10_s$ will be considered, this being the way in which they are referenced in the close-up of FIG. 1b. This precise positioning is obtained by means of centering pins 15 arranged on the upper surface of the lower frame $10_i$, for Which there are corresponding holes or reinforcements 16 arranged on the lower face of the upper frame $10_s$ and intended to receive the centering pins 15 of the frame $10_i$ as the framed substrates are being stacked in the package 20. According to another embodiment, the centering pins are arranged on the lower face of the upper frame and the holes or reinforcements are arranged on the upper face of the lower frame. These centering pins make it optionally possible to position the framed substrates with respect to one another before the set of stacked substrates is installed in the package.

As illustrated in FIG. 1a, the package 20 may also have a specific interior profile corresponding to an exterior profile of the frames, which is complementary to that of the package, thus facilitating pre-positioning of the frames in the package.

The set of framed substrates 5 is fixed in the package by fastening means 40 contained in the cover 30, for example, and intended to fit to the package 20; these fastening means 40 are, for example, screws as illustrated in FIGS. 1a and 1b.

As illustrated in FIG. 1b, the cover 30 which contains the input-output interface 31 preferably also comprises reinforcements 16 intended to receive the centering pins 15 of the frame of the 1$^{st}$ substrate 5a, so as to provide a good electrical interconnection between the input-output interface 31 and this substrate 5a.

The positioning of the framed substrates 5 with respect to one another in the package 20 is not definitive: the framed substrates 5 can thus be easily removed from the package 20 and may optionally be detached from one another, for example in order to be replaced or modified. The framed substrates are interchangeable and a modular device is thus obtained.

The precise positioning of the framed substrates with respect to one another and that of the set of framed substrates in the package is meaningless unless each substrate 5 is itself precisely positioned with respect to its frame 10. The edges of a frame have an L-shaped profile: the edges of the substrate rest on the base of the L. When the frame also has a bottom 13 which extends this base of the L, the substrate 5 then rests entirely on the base 13. Precise positioning of the substrate 5 in its frame 10 may also be provided by other centering pins present on the base of the L, and corresponding holes or reinforcements (not shown) present on the support of the substrate. Once positioned in this way with respect to the frame 10, the substrate 5 is then fixed to the frame 10, for example by means of an adhesive.

Figure 2:
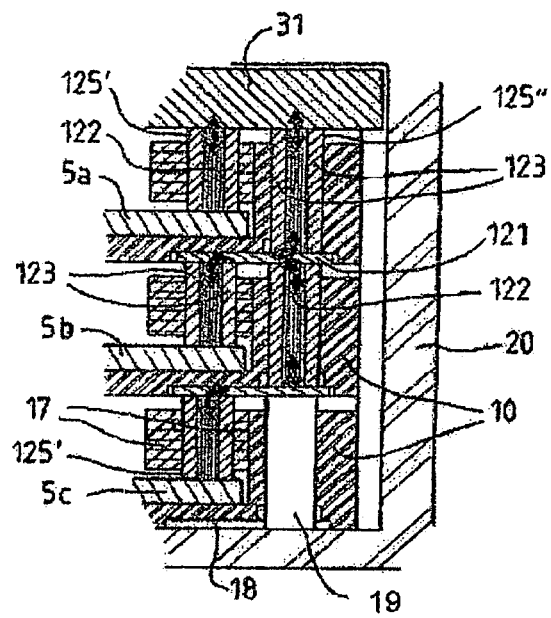

The interconnection element 120 present in one side of the frame 12 will now be considered in more detail, taking as an example a 3D electronic module having a 1$^{st}$, a 2$^{nd}$ and a 3$^{rd}$ substrate, respectively referenced 5a, 5b and 5c in FIG. 2.

Figure 3:
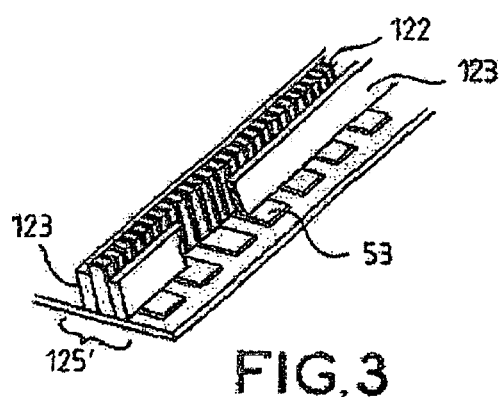

The interconnection element of the last frame will be considered first, i.e. that of the substrate 5c in our example. This interconnection element comprises a first connector 125' in contact with the tracks 53 of the substrate 5c, as represented in FIG. 3.

The interconnection element of the other frames, those of the substrates 5a and 5b in our example represented in FIG. 2, furthermore comprise a first connector 125' in contact with the tracks of the corresponding substrate, and a second connector 125" in contact with a routing circuit 121. This routing circuit 121 is also intended to be in contact with the first connector 125' of the lower frame, and optionally with the second connector 125" of the lower frame when this second connector 125" exists, as illustrated by the bidirectional arrows. The term bus refers to the set of elements 125" communicating via the routing circuit(s) 121. The routing circuit 121 of each of the interconnection elements is matched according to the intended electrical connections. It is of course positioned very precisely with respect to the tracks of the substrate.

A routing circuit is typically a multilayer printed circuit (for example 5 or 6 layers) making it possible to redistribute the signals coming from a substrate to the inputs-outputs of the routing circuit, or vice versa. Each layer of the routing circuit comprises two parts, one facing the element 125' and therefore intended to be connected to the tracks of the substrate, the other facing the element 125" and therefore intended to be connected to the bus. Depending on the electrical connections intended between the tracks of the substrate and the bus, tracks are established from one part of the layer to the other. The tracks should not cross; even when an electrical connection requires a new track crossing another, this new track is placed on another layer.

The electrical connection between the first connector 125' and the second connector 125" of the first substrate 5a is provided via a routing circuit (not shown) contained in the input-output interface 31. The electrical connection between the first connector 125' of the first substrate 5a and the input-output interface 31 is provided via the routing circuit of the input-output interface 31 or directly.

As illustrated in FIG. 3, the connector 125' or 125" includes conductive rings 122 contained between two insulators 123, for example made of elastomer. Another type of connector may be used. In view of the width of the rings (for example 30 μm) and their spacing (for example 20 μm), and those of the tracks of the substrate (approximately 200 μm wide, spaced apart by 150 μm), a plurality of rings are in contact with one track.

The use of routing circuits makes it possible to modify the interconnections between a substrate and the other substrates and/or between a substrate and the input-output interface, without intervening on the substrate or on the package: it is sufficient to modify the routing circuit. This results in enhanced interchangeability and modularity.

Figure 4:
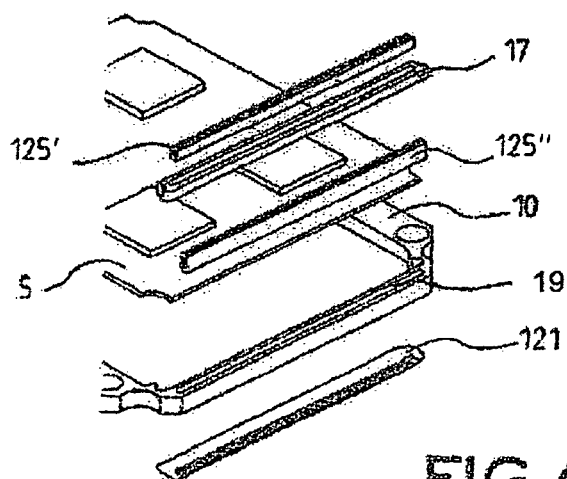

FIG. 2 furthermore represents the package 20, a recess 19 pre-hollowed in the side 12 of the frame and intended to hold the second connector 125" when there is one, a compartment 18 intended to hold a routing circuit 121 when there is one, and a recess 17 intended to hold a first connector 125' then to be placed on the substrate 5 corresponding to it. These elements are also represented in the exploded view of FIG. 4.

Once the framed substrates 5a, 5b, 5c in FIG. 2 are stacked on one another in the package 20 and the input-output interface 31 is placed on the upper framed substrate 5a, the connectors 125' and 125" and the corresponding routing circuits 121 are then in contact.

A prototype according to the invention was produced with three substrates. The 3D electronic module obtained has approximately the following dimensions: 55 mm×55 mm×12.6 mm.

The electronic module according to the invention may of course contain a different number of electronic substrates.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. An electronic substrate suitable for being included in a stack including said electronic substrate and another electronic substrate and suitable for being connected to the other electronic substrate and to an input-output interface, said electronic substrate comprising:

a frame made of a material with a high thermal conductivity having a plurality of sides, a first side of said electronic substrate intending to be in contact with a corresponding side of the frame of another neighboring substrate so as to provide thermal dissipation of the electronic substrates and a second side of said electronic substrate comprising an interconnection element intended to provide electrical interconnection between said electronic substrate and the other electronic substrate by means of a routing circuit suitable for being matched according to the electrical interconnection and/or between said electronic substrate and the input-output interface, the frame having a bottom also having a material with a high thermal conductivity, wherein the bottom includes a phase-change cooling element;

wherein said electronic substrate has conductive tracks and in that the interconnection element includes a first conductive element intended to be in contact with the tracks;

wherein the interconnection element also includes a second conductive element intended to be connected to the routing circuit with a view to connecting this second conductive element to a conductive element of the interconnection element of the frame of the other neighboring electronic substrate.

2. The electronic substrate as claimed in claim 1, wherein the conductive element comprises conductive rings inserted between two insulators.

3. The electronic substrate as claimed in claim 1, wherein the routing circuit is a multilayer printed circuit.

4. The electronic substrate as claimed in claim 1, wherein the frame includes reversible positioning means intended to position said frame with respect to the frame of the other neighboring electronic substrate and/or with respect to the input-output interface.

5. The electronic substrate as claimed in claim 4, wherein the reversible positioning means include first centering pins and reinforcements.

6. The electronic substrate as claimed in claim 1, wherein the frame includes second centering pins intended to position said substrate in its frame.

7. The electronic substrate as claimed in claim 1, wherein the substrate is fixed to its frame by means of an adhesive.

8. The electronic substrate as claimed in claim 1, wherein the material with a high conductivity is aluminum or copper or graphite.

9. The electronic substrate as claimed in claim 1, wherein the substrate includes a support made of epoxy or ceramic or gallium arsenide or of a metallized insulator.

10. The electronic substrate as claimed in claim 1, wherein the frame has four sides and in that two first sides are intended for the thermal dissipation and two second sides each include an interconnection element.

11. The electronic substrate as claimed in claim 1, wherein it has a surface area of approximately $5 \times 5$ cm$^2$.

12. An electronic module having an input-output interface and a stack of a plurality of electronic substrates as claimed in claim 1;

wherein it furthermore has a package suitable for holding the stack of framed electronic substrates;

wherein it includes a cover comprising the input-output interface; and wherein cover including means for fastening to the package and in that the fastening means are suitable for stabilizing the framed substrates in the package.

13. The electronic module as claimed in claim 12, wherein the fastening means are reversible.

14. The electronic module as claimed in claim 12, wherein the package consists of a material with a high thermal conductivity.

15. The electronic module as claimed in claim 12, wherein the package has a specific interior profile and in that each frame has an exterior profile complementary to that of the package, with a view to facilitating pre-positioning of the frames in the package.

* * * * *